US012588512B2

(12) United States Patent
Chen et al.

(10) Patent No.:  US 12,588,512 B2
(45) Date of Patent:     Mar. 24, 2026

(54) GENERATION OF PHYSICALLY UNCLONABLE FUNCTION USING ONE-TIME-PROGRAMMABLE MEMORY DEVICES WITH BACKSIDE INTERCONNECT STRUCTURES

(71) Applicant: Taiwan Semiconductor Manufacturing Company, Ltd., Hsinchu (TW)

(72) Inventors: Yuhsiang Chen, Hsinchu City (TW); Meng-Sheng Chang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 157 days.

(21) Appl. No.: 18/402,130

(22) Filed: Jan. 2, 2024

(65) Prior Publication Data

US 2025/0070053 A1      Feb. 27, 2025

Related U.S. Application Data

(60) Provisional application No. 63/520,818, filed on Aug. 21, 2023.

(51) Int. Cl.
*G11C 17/16*        (2006.01)
*G11C 17/18*        (2006.01)
(Continued)

(52) U.S. Cl.
CPC ............ *H01L 23/573* (2013.01); *G11C 17/16* (2013.01); *G11C 17/18* (2013.01); *H10B 20/25* (2023.02)

(58) Field of Classification Search
CPC ...................................................... G11C 17/16
See application file for complete search history.

(56) References Cited

U.S. PATENT DOCUMENTS 10,177,924 B1 *   1/2019   Chen ..................... H04L 9/3278
2009/0316466 A1   12/2009   Xu et al.
(Continued)

FOREIGN PATENT DOCUMENTS

| TW | 202141760 A | 11/2021 |
| TW | 202312440 A | 3/2023 |
| TW | 202316579 A | 4/2023 |

OTHER PUBLICATIONS

Office Action issued in connection with Taiwan Appl. No. 113113448 dated Mar. 18, 2025.

*Primary Examiner* — Hoai V Ho
(74) *Attorney, Agent, or Firm* — Foley & Lardner LLP

(57) ABSTRACT

A semiconductor device includes a memory cell randomly presenting a first logic state or a second logic state and formed on a first side of a substrate, and a first and a second bit lines formed on a second side of the substrate opposite to the first side. The memory cell includes: a programming transistor having a first and a second source/drain terminals; a first reading transistor having a first source/drain terminal coupled to the first source/drain terminal of the programming transistor; and a second reading transistor having a first source/drain terminal coupled to the second source/drain terminal of the programming transistor. The first bit line is operatively coupled to a second source/drain terminal of the first reading transistor, and the second bit line is operatively coupled to a second source/drain terminal of the second reading transistor.

20 Claims, 11 Drawing Sheets

(51) Int. Cl.
    *H01L 23/00*           (2006.01)
    *H10B 20/25*           (2023.01)

(56)                  References Cited

U.S. PATENT DOCUMENTS

| | | | |
|---|---|---|---|
| 2010/0061137 A1 | 3/2010 | Kim | |
| 2015/0287730 A1 | 10/2015 | Wu et al. | |
| 2021/0202504 A1* | 7/2021 | Chang | H01L 23/5252 |
| 2021/0399014 A1* | 12/2021 | Wu | H10B 51/10 |
| 2022/0059551 A1* | 2/2022 | Chern | H10D 64/01 |
| 2023/0064751 A1* | 3/2023 | Chang | H01L 23/5252 |
| 2023/0260557 A1 | 8/2023 | Chang et al. | |

* cited by examiner

600

S610

PROVIDING A MEMORY CELL

S620

APPLYING A PROGRAMMING VOLTAGE

S630

APPLYING A READING VOLTAGE

S640

GENERATING A BIT OF A PUF SIGNATURE

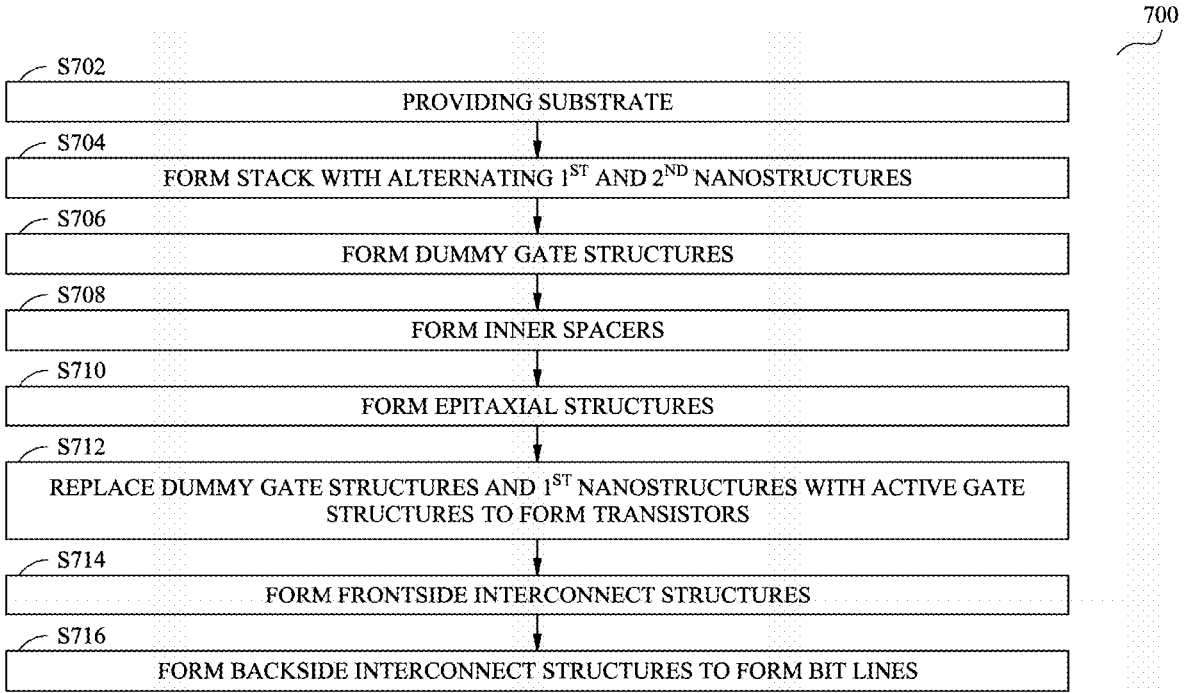

700

S702
PROVIDING SUBSTRATE

S704
FORM STACK WITH ALTERNATING 1ST AND 2ND NANOSTRUCTURES

S706
FORM DUMMY GATE STRUCTURES

S708
FORM INNER SPACERS

S710
FORM EPITAXIAL STRUCTURES

S712
REPLACE DUMMY GATE STRUCTURES AND 1ST NANOSTRUCTURES WITH ACTIVE GATE STRUCTURES TO FORM TRANSISTORS

S714
FORM FRONTSIDE INTERCONNECT STRUCTURES

S716
FORM BACKSIDE INTERCONNECT STRUCTURES TO FORM BIT LINES

Fig. 7

GENERATION OF PHYSICALLY UNCLONABLE FUNCTION USING ONE-TIME-PROGRAMMABLE MEMORY DEVICES WITH BACKSIDE INTERCONNECT STRUCTURES

CROSS-REFERENCE TO RELATED APPLICATION

This application claims priority to and the benefit of U.S. Provisional Application No. 63/520,818, filed Aug. 21, 2023, which is incorporated herein by reference in its entirety for all purposes.

BACKGROUND

Integrated circuits (ICs) sometimes include one-time-programmable (OTP) memories to provide non-volatile memory (NVM) in which data are not lost when the ICs are powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor coupled in series. A gate dielectric of the programming MOS transistor may be broken down to cause the gate and the source or drain of the programming MOS transistor to be interconnected. Depending on whether the gate dielectric of the programming MOS transistor is broken down, different data bit can be presented by the anti-fuse memory cell through reading a resultant current flowing through the programming MOS transistor and reading MOS transistor. The anti-fuse memories have the advantages of reverse-engineering proofing since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is an example flow chart of a method for forming a memory device in accordance with some embodiments.

DETAILED DESCRIPTION

Figure 1A:
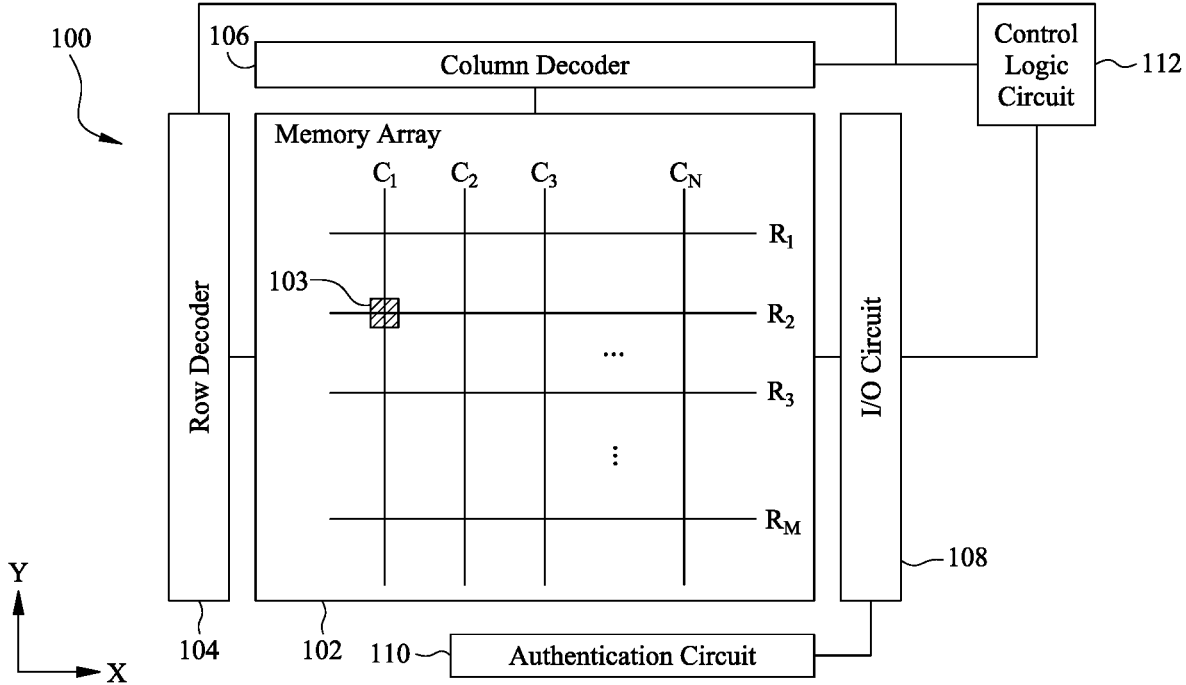
FIG. 1A illustrates a block diagram of an example memory system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A physically unclonable function (PUF) is generally used for authentication and secret key storage without requiring secure electrically erasable programmable read-only memory (EEPROMs) and/or other expensive hardware (e.g., battery-backed static random-access memory). Instead of storing secrets in a digital memory, the PUF derives a secret from physical characteristics of an integrated circuit (IC). The PUF is based on an idea that even though an identical manufacturing process is used to fabricate a number of ICs, each IC may be slightly different from one another due to manufacturing variability. PUFs leverage this variability to derive "secret" information that is unique to each of the ICs (e.g., a silicon biometric). Generally, such secret information is referred to as a "PUF signature" of the IC. In addition, due to the manufacturing variability that defines the PUF signature, one cannot manufacture two identical ICs even with full knowledge of the IC's design. Various types of variability of an IC can be used to define such a signature such as, for example, gate delay(s), power-on state(s) of a memory device, and/or any of a variety of physical characteristics of an IC.

Embodiments of the present disclosure provide various systems and methods to generate a PUF signature for/from a memory device that includes a number of memory cells.

Each of the memory cells is implemented as an anti-fuse cell, with a symmetrical configuration, and includes at least a first and a second reading transistors, and a programming transistor coupled between the first and the second reading transistors in series and including a gate terminal having a gate metal and a gate dielectric layer. The gate dielectric layer includes a first dielectric portion coupled between the gate metal and a source/drain terminal of the programming transistor, and a second dielectric portion coupled between the gate metal and another source/drain terminal of the programming transistor. Even though the first and the second dielectric portions of the gate dielectric layer of the programming transistor are formed of the same material and in the same dimension, while being concurrently programed by the same programming voltage, one of the first and the second dielectric portions of the gate dielectric layer can precede the other to be broken down. Upon one of the first and the second dielectric portions being broken down, the programming process spontaneously stops. Alternatively stated, one of the two dielectric portions of the gate dielectric layer can be randomly programmed (or broken down) to equivalently form a resistor. Based on which one of the first and the second dielectric portions has been broken down, the disclosed system can generate a PUF bit for/from a memory cell of the memory device. Applying the same principle to all of the memory cells, the disclosed system can generate a unique PUF signature for/from the memory device.

Since the reading transistors are symmetrically disposed next to the programming transistor, the voltage level at a virtual node that connects both the reading transistors to a virtual end of the programming transistor can be pulled further close to ground. As such, the programming voltage applied on the other virtual end of the programming transistor is not required to be that high to effectively program (or break down) the programming transistor. With such a symmetrical configuration, the memory cells of the memory device can be programmed at a relatively low programming voltage, thereby advantageously reducing power consumption and improving lifetime of the memory device.

In some embodiments, each of the anti-fuse cell memory cells includes a first and a second reading transistors, a programming transistor coupled between the first and the second reading transistors in series, one or more first stage (middle or complementary) transistors coupled between the programming transistor and the first reading transistor in series, and one or more second stage (middle or complementary) transistors coupled between the programming transistor and the second reading transistor in series. Each of the first and the second stage transistors is formed to have the same structure and dimension. The number (e.g., N=1, 2, 3, 4) of the first stage transistors and the number of the second stage transistors are the same. With the additional stage transistors, IR drops in each of the memory cells can be reduced, thereby advantageously enhancing programing and reading performance of the memory device.

In some embodiments, a memory device includes a programming transistor coupled between a first and a second reading transistors in series formed on a frontside of a substate, and a first and a second bit lines formed on a backside of the substrate and operatively coupled to the first and the second reading transistors. With such a configuration of forming bit lines on the backside of the substrate, the PUF bit-cell size of the memory device is advantageously reduced.

FIG. 1A illustrates a memory system 100 in accordance with various embodiments. As shown in FIG. 1A, the memory system 100 includes a memory array 102, a row decoder 104, a column decoder 106, an input/output (I/O) circuit 108, an authentication circuit 110, and a control logic circuit 112. Despite not being shown in FIG. 1A, all of the components of the memory system 100 may be coupled to each other and to the control logic circuit 112. Although, in the illustrated embodiment of FIG. 1A, each component is shown as a separate block for the purpose of clear illustration, in some other embodiments, some or all of the components shown in FIG. 1A may be integrated together. For example, the memory array 102 may include an embedded authentication circuit (e.g., 110).

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1$, $R_2$, $R_3$ .... $R_M$, each extending in a first direction (e.g., X-direction) and a number of columns $C_1$, $C_2$, $C_3$ ... $C_N$, each extending in a second direction (e.g., Y-direction). Each of the rows/columns may include one or more conductive structures function as access lines. In some embodiments, each memory cell 103 is arranged at an intersection of a corresponding row and a corresponding column, and can be operated according to voltages or currents through the respective conductive structures of the column and row.

Each memory cell 103 can be embodied as an anti-fuse memory cell. Referring to e.g., FIG. 1B, an anti-fuse memory cell 103 includes a first reading transistor 124 and a second reading transistor 126, and a programming transistor 120 coupled therebetween in series. The programming transistor 120 includes a gate dielectric layer 123, which is disposed under a gate metal 121 and has a first dielectric portion 123A and a second dielectric portion 123B. The programming transistor 120 is programmed by applying a programming voltage, and randomly, one of the first dielectric portion 123A or the second dielectric portion 123B is broken down faster than the other. Then the programming stops, and the other one of the first dielectric portion 123A or the second dielectric portion 123B remains intact. Thus, a logic state (e.g., 1 or 0) of the memory cell 103 can be generated based on which one of the first dielectric portion 123A or the second dielectric portion 123B was broken down. Such a randomly generated logic state for each of the memory cells 103 can constitute the basis of a PUF signature of the memory device 100.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a pair of source lines) at that column address. The I/O circuit 108 is a hardware component that can access (e.g., read, program) each of the memory cells 103 asserted through the row decoder 104 and column decoder 106. The authentication circuit 110 is a hardware component that can generate a PUF signature based on respective logic states of the memory cells read by the I/O circuit 108. The control logic circuit 112 is a hardware component that can control the coupled components (e.g., 102 through 110).

Figure 1B:
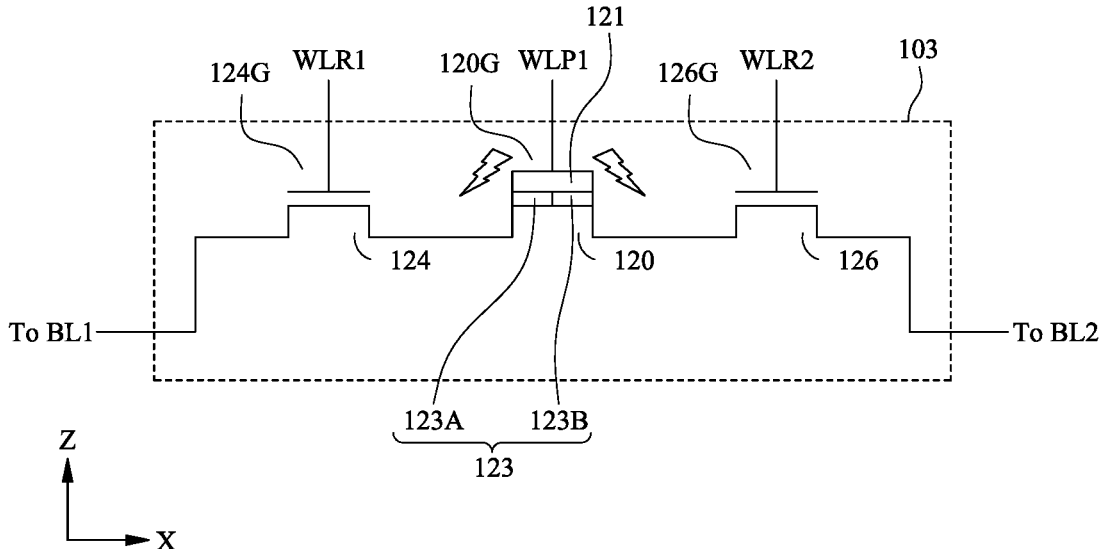
FIG. 1B illustrates an example circuit diagram of an anti-fuse memory cell of an anti-fuse memory array of the memory device in FIG. 1A in accordance with some embodiments.

FIG. 1B illustrates an example circuit diagram of a memory cell 103 of the array 102 of the memory device 100 in FIG. 1A in accordance with some embodiments. In some embodiments, each memory cell 103 is embodied as an anti-fuse memory cell. It should be appreciated that the memory array 102 can have any number of anti-fuse memory cells 103, while remaining within the scope of present disclosure. The anti-fuse memory cell 103 in FIG. 1B is explained in detail as a representative example in the following discussions.

In some embodiments, as mentioned above, each of the memory cells 103 in FIG. 1A can be operatively coupled to the I/O circuit 108 through respective programming word lines (WLPs), reading word lines (WLRs), and bit lines (BLs) for being accessed (e.g., programmed or read). Referring to FIGS. 1A and 1B, the I/O circuit 108 can cause the row decoder 104 to assert WLP1, WLR1 and WLR2, and the column decoder 106 to assert BL1 and BL2 so as to select and thus enable a particular memory cell 103 to be programmed or read. Otherwise, the particular memory cell 103 is unselected and thus unable to be programmed or read. Accordingly, each of the memory cells 103 can be individually selected and thus can be programmed or read. Details about programming and reading memory cells will be further discussed below.

In some embodiments, each of the anti-fuse memory cells 103 includes one or more first and second reading transistors, and a programming transistor coupled between the one or more first and second reading transistors in series. In some embodiments, the number of the one or more first reading transistors and the number of the one or more second reading transistors are the same integers equal to or greater than 1 (such as 1, 2, 3, . . . N).

As shown in FIG. 1B, in some embodiments, a memory cell 103 includes a programming transistor 120 gated by WLP1, a first reading transistor 124 gated by WLR1, and a second reading transistor 126 gated by WLR2, in which the programming transistor 120 is coupled between the first reading transistor 124 and the second reading transistor 126 in series. A source/drain (S/D) terminal of the first reading transistor 124 is coupled to a first bit line BL1, and a source/drain (S/D) terminal of the second reading transistor 126 is coupled to a second bit line BL2. More details about the configurations and connections regarding the memory cell 103 will be explained in view of FIGS. 2A, 2B and 2C.

As shown in FIG. 1B, in some embodiments, the programming transistor 120 of the anti-fuse memory cell 103 includes a gate terminal 120G, which includes a gate metal 121 and a gate dielectric layer 123 that is made of a dielectric material and deposited under the gate metal 121. In some embodiments, the dielectric material of the gate dielectric layer 123 is selected from $HfO_2$, HfSiO, HfSiON, HfTaO, HfTiO, HfZrO, zirconium oxide, aluminum oxide, titanium oxide, and/or combinations thereof. The gate dielectric layer 123 includes a first dielectric portion 123A and a second dielectric portion 123B that have the same dimension and can be concurrently or separately turned on/off to enable/disable an access (e.g., for programing or reading) to the programming transistor 120.

In a programming process, in some embodiments, to enable programming of the programming transistor 120 of the anti-fuse memory cell 103, a program-enabling voltage (e.g., 1.2V) can be concurrently or separately applied to gates 124G and 126G of the first and the second reading transistors 124 and 126 of the memory cell 103. Upon being enabled, the programming transistor 120 of the memory cell 103 can be programmed by applying a programming voltage (e.g., 5V) to its gate 120G and applying a low bit line voltage (e.g., 0V) to the bit lines BL1 and BL2.

In the programming process, randomly, one of the first and the second dielectric portions 123A and 123B of the gate dielectric layer 123 of the programming transistor 120 of the selected memory cell 103 can be broken down faster than the other one, even though the possibility or chance for any one of them is 50%. After one (e.g., 123A) of the first and the second dielectric portions has been broken down first, the programming process stops, and thus the other one (e.g., 123B) remains intact. Consequently, a logic state or bit (e.g., 1) of logic states (1 or 0) of the memory cell 103 can be randomly generated based on whether the first dielectric portion 123A or the second dielectric portion 123B of its gate dielectric layer 123 has been broken down, and thus a bit of the PUF signature (or a PUF signature bit) for the anti-fuse memory cell 103 is generated. Such a mechanism of randomly generating the bit of the PUF signature for the anti-fuse memory cell 103 in FIG. 1B applies to all of the memory cells 103 in FIG. 1A. In this way, the PUF signature of the memory device 100 in FIG. 1A can be generated.

In a reading process, in some embodiments, the anti-fuse memory cells 103 is selected and thus read by applying a reading selection voltage (e.g., 1.5V) to the gate 120G of its programming transistor 120, applying a reading selection voltage (e.g., Vdd of 0.75V) to the gates 124G and 126G of its first and second reading transistors 124 and 126, and applying a low BL voltage (e.g., 0V) to corresponding source/drain terminals of its first and second reading transistors 124 and 126 through bit lines BL1 and BL2. In the reading process, in other embodiments, the anti-fuse memory cells 103 is unselected and thus not read by applying a non-selection voltage (e.g., 0V) to the gate 120G of its programming transistor 120, applying a non-reading voltage (e.g., Vss) to the gates of its first and second reading transistors 124 and 126, and applying a high BL voltage (e.g., 0.75V) to its terminals respectively coupled to BL1 and BL2.

Figure 1C:
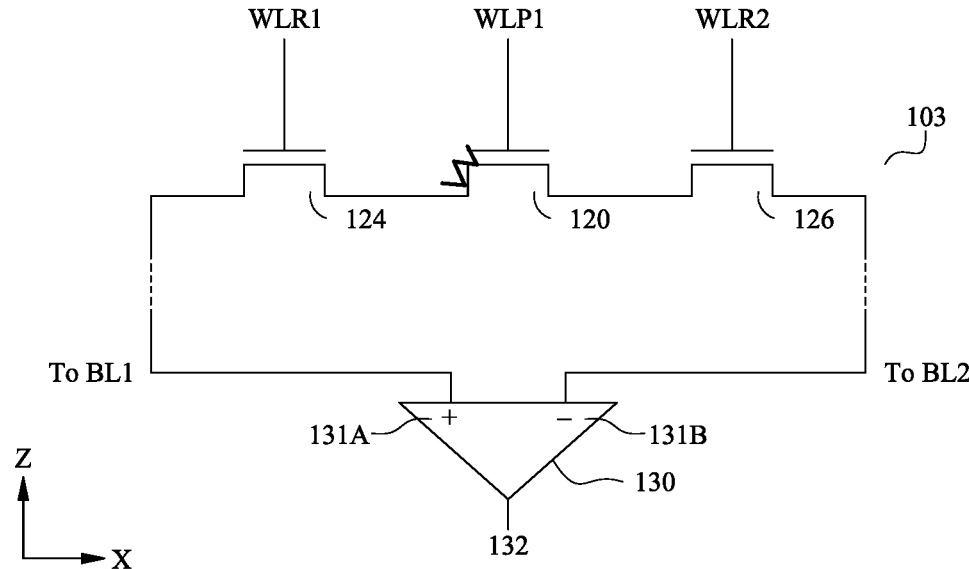
FIG. 1C illustrates an example circuit diagram of the anti-fuse memory cell in FIG. 1B connected to a differential amplifier in accordance with some embodiments.

FIG. 1C illustrates an example circuit diagram of the anti-fuse memory cell 103 in FIG. 1B that is connected to a differential amplifier 130 in accordance with some embodiments. In other embodiments, the anti-fuse memory cell includes a differential amplifier inside thereof (not shown), while remaining within the scope of the present disclosure. In some embodiments, the differential amplifier 130 has a first and a second input terminals 131A and 131B respectively coupled to bit lines BL1 and BL2, and an output terminal 132 to output a state result (e.g., 1 or 0) of the memory cell 103. The result represents whether the first dielectric portion 123A or the second dielectric portion 123B of the gate dielectric layer 123 of the memory cell 103 has been broken down based on an appreciable current detected in the first input terminal 131A or the second input terminal 131B, thereby determining a logic state of the memory cell 103.

For example, in the reading process, upon detecting an appreciable current in the first input terminal 131A, the first dielectric portion 123A is determined to have been broken down, and thus the memory cell 103 is determined to be in a first logic state "1". Otherwise, upon detecting an appreciable current in the second input terminal 131B, the second dielectric portion 123B is determined to have been broken down, and thus the memory cell 103 is determined to be in second logic state "0." Such a mechanism of reading a logic state (a PUF signature bit) of the memory cell 103 in FIG. 1B applies to all of the memory cells 103 in FIG. 1A. In this way, a PUF signature of the memory device 100 in FIG. 1A is read and thus authenticated.

Figure 2A:
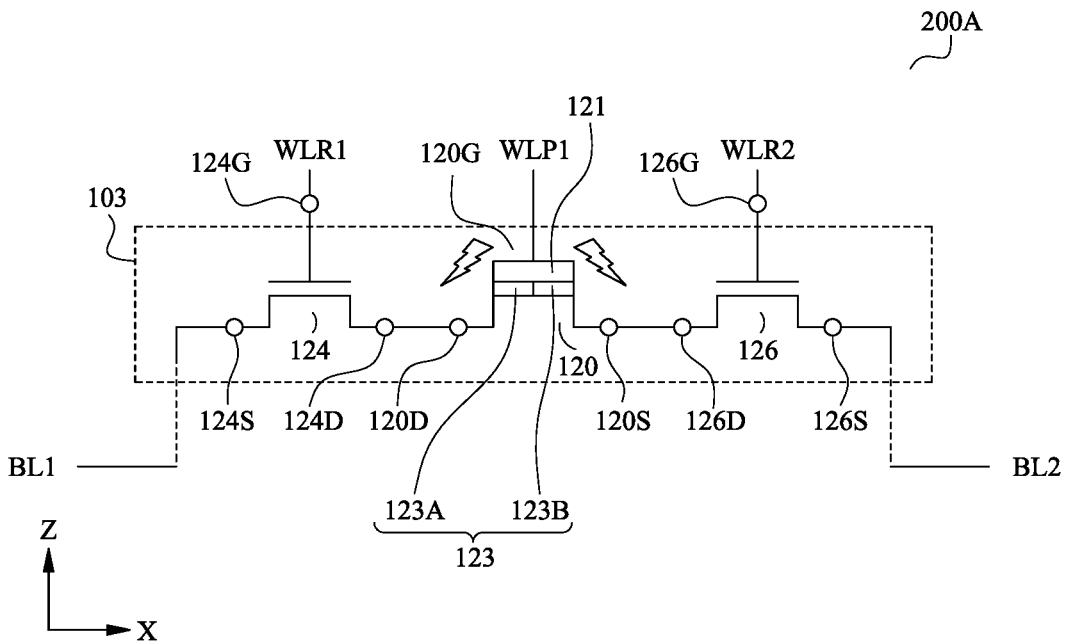
FIG. 2A illustrates an example circuit diagram of a portion of a memory device in accordance with some embodiments.

FIG. 2A illustrates an example circuit diagram of a memory device 200A in accordance with some embodiments. The anti-fuse memory cell 103 of the memory device 200A as shown in FIG. 2A is configured substantially similar to the anti-fuse memory cell 103 in FIG. 1B. As shown in FIG. 2A, the anti-fuse memory cell 103 is implemented as a three-transistor (3T) symmetric configuration, and includes a programming transistor 120, a first reading transistor 124, and a second reading transistor 126, in which the programming transistor 120 is electrically coupled between the first reading transistor 124 and the second reading transistor 126 in series. In some embodiments, the memory device 200A also includes a first bit line BL1 and a second bit line BL2 respectively coupled to the first and the second reading transistors 124 and 126 of the anti-fuse memory cell 103.

Also referring to FIG. 2A, a source/drain terminal 120D of the programming transistor 120 is coupled to a source/drain terminal 124D of the first reading transistors 124, and the other source/drain terminal 120S of the programming transistor 120 is coupled to a source/drain terminal 126D of the second reading transistor 126. The programming transistor 120 is gated by WLP1 via its gate terminal 120G, the first reading transistor 124 is gated by WLR1 via its gate terminal 124G, and the second reading transistor 126 is gated by WLR2 via its gate terminal 126G. In some embodiments, a source/drain terminal 124S of the first reading transistor 124 is operatively coupled to a first bit line BL1, and a source/drain terminal 126S of the second reading transistors 126 is operatively coupled to a second bit line BL2.

Further referring to FIG. 2A, the gate terminal 120G of the anti-fuse memory cell 103 includes a gate metal 121, and a gate dielectric layer 123 that has a first dielectric portion 123A and a second dielectric portion 123B. The first dielectric portion 123A is coupled between the gate metal 121 and the source/drain terminal 120D of the programming transistor 120, and the second dielectric portion 123B is coupled between the gate metal 121 and the other source/drain terminal 120S of the programming transistor 120.

As mentioned above, the memory cell 103 randomly presents a logic state of either a first logic state (e.g., 1) or a second logic state (e.g., 0) based on which of the first dielectric portion 123A or the second dielectric portion 123B of a gate dielectric layer 123 of the memory cell 103 is determined to have been broken down. The ways of generating and reading a bit of PUF signature (a PUF signature bit) for/from the anti-fuse memory cell 103 mentioned above with respect to FIG. 1B also apply to the anti-fuse memory cell 103 in FIG. 2A. As such, a PUF signature for/from the memory device 200A can be generated and authenticated.

Figure 2B:
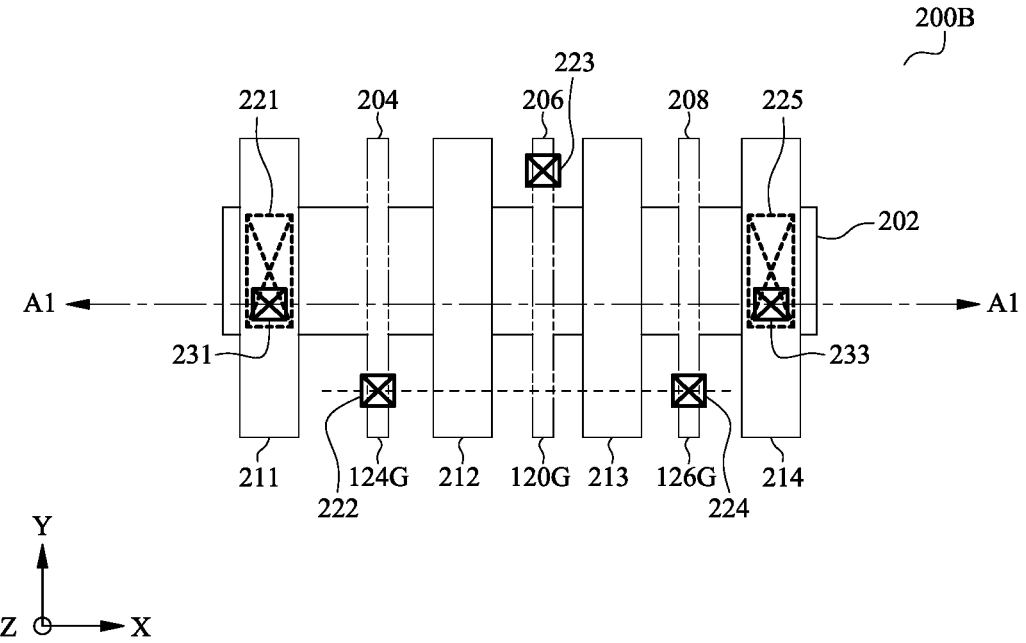
FIG. 2B illustrates an example layout to form the portion of the memory device in FIG. 2A in accordance with some embodiments.
Figure 2C:
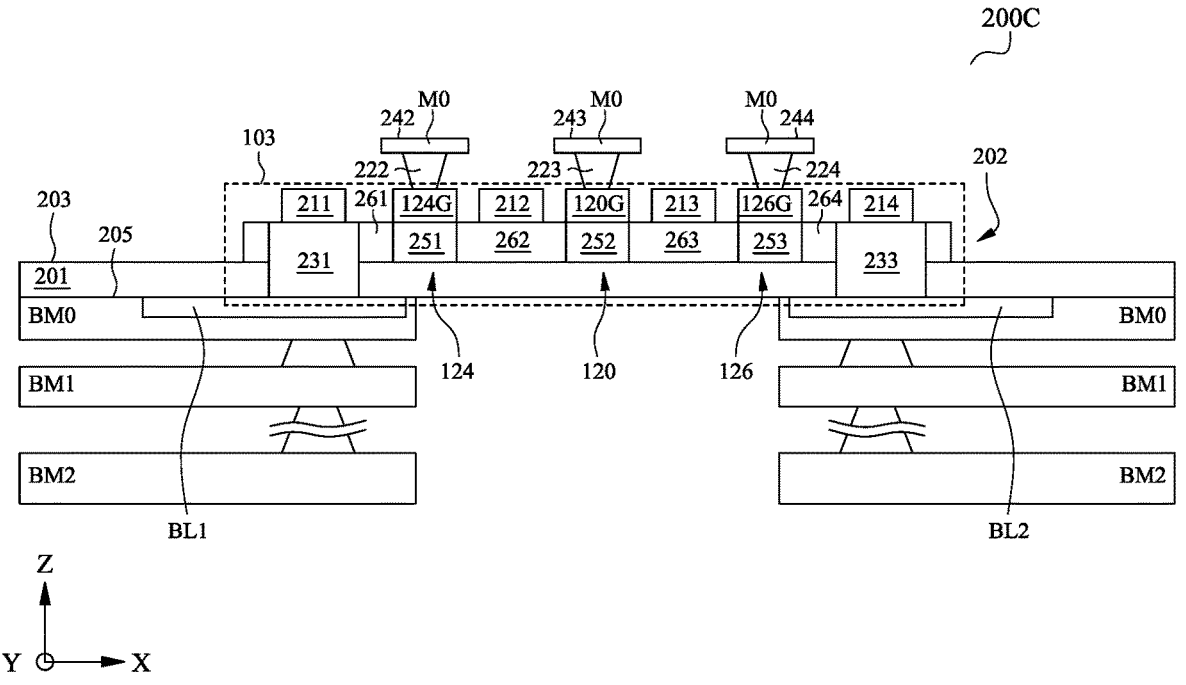
FIG. 2C illustrates an example cross-sectional view of the portion of the memory device in FIG. 2B in accordance with some embodiments.

FIG. 2B illustrates an example layout 200B to form the memory device 200A in FIG. 2A in accordance with some embodiments. FIG. 2C illustrates an example cross-sectional view of a memory device 200C along a line A1-A1 in FIG. 2B in accordance with some embodiments. The layout 200B includes a pattern 202 configured to form an active region (hereinafter "active region 202"), and multiple patterns 204, 206 and 208 configured to form gate structures (hereinafter "gate structure 204," "gate structure 206," "gate structure 208," respectively). It should be understood that the layout 200B as shown in FIG. 2B is simplified for illustration purposes, and thus the layout 200B can include various other patterns, while remaining within the scope of present disclosure.

As shown in FIG. 2B, the active region 202 may extend along a first lateral direction (e.g., X-direction), while the gate structures 204, 206 and 208 may extend along a second lateral direction (e.g., Y-direction) different from the first lateral direction. According to various embodiments, a layout used to fabricate an anti-fuse memory array may include a number of the layouts that are similar to that as shown in FIG. 2B and repeatedly arranged along the X-direction and Y-direction. However, it should be understood that such a layout can include any number of active regions and gate structures, while remaining within the scope of present disclosure.

According to embodiments, the active region 202 is formed of a stack structure protruding from a major surface (e.g., 203 in FIG. 2C) of a substrate. The stack includes a number of semiconductor nanostructures (e.g., nanosheets) extending along the X-direction and vertically separated from each other. Portions of the semiconductor structures in the stack that are overlaid by the gate structures 204, 206 and 208 remain, while other portions are replaced with a number of epitaxial structures. In some embodiments, such active regions and gate structures are formed along the major frontside surface of a substrate (sometimes referred to as part of "front-end-of-line (FEOL) processing/network"). Over the frontside surface of the substrate, a number of frontside metallization layers (e.g., M0 in FIG. 2C) can be formed (sometimes referred to as part of "back-end-of-line (BEOL) processing/network"), and over a backside surface (e.g., 205 in FIG. 2C) of the substrate, a number of backside metallization layers (e.g., BM0, BM1, BM2 in FIG. 2C) can be formed.

The remaining portions of the semiconductor structures can be configured as the channel of a corresponding transistor, the epitaxial structures coupled to both sides (or ends) of the remaining portions of the semiconductor structures can be configured as source/drain structures (or terminals) of the transistor, and a portion of the gate structure that overlays (e.g., straddles) the remaining portions of the semiconductor structures can be configured as a gate structures (or terminal) of the transistor.

A portion of the active region portion 202 overlaid by the gate structure portion 206 may form and function as a channel of the programming transistor 120 in FIG. 2A. Portions of the active region portion 202 disposed on opposite sides of the gate structure portion 206 are replaced with epitaxial structures. Such epitaxial structures can respectively function as the source/drain terminals 120D and 120S of the programming transistor 120 in FIG. 2A. The gate structure portion 206 can function as the gate terminal 120G of the programming transistor 120 in FIG. 2A.

A portion of the active region portion 202 overlaid by the gate structure portion 204 may form and function as a channel of the first reading transistor 124 in FIG. 2A. Portions of the active region portion 202 disposed on opposite sides of the gate structure portion 204 are replaced with epitaxial structures. Such epitaxial structures can function as the source/drain terminals 124D and 124S of the first reading transistor 124 in FIG. 2A, respectively. The gate structure portion 204 can function as the gate terminal 124G of the first reading transistor 124 in FIG. 2A.

A portion of the active region portion 202 overlaid by the gate structure portion 208 may form and function as a channel of the second reading transistor 126 in FIG. 2A. Portions of the active region portion 202 disposed on opposite sides of the gate structure portion 208 are replaced with epitaxial structures. Such epitaxial structures can respectively function as the source/drain terminals 126D and 126S of the second reading transistor 126 in FIG. 2A. The gate structure portion 208 can function as the gate terminal 126G of the second reading transistor 126 in FIG. 2A.

As shown in FIG. 2B, the layout 200B also includes patterns to form interconnect structures or via structures. For example, the layout 200B includes patterns 211, 212, 213 and 214, each of which is configured to form a middle-end interconnect structure, sometimes referred to as an MD (hereinafter "MD 211," "MD 212," "MD 213" and "MD 214" respectively), that connects a corresponding source/drain terminal to an upper interconnect structure. The layout 200B also includes patterns 221, 222, 223, 224 and 225, each of which is configured to form a via structure, sometimes referred to as a VG (hereinafter "VG 221," "VG 222," "VG 223," "VG 224" and "VG 225" respectively) that connects a corresponding gate terminal (or gate structure) to an upper interconnect structure (e.g., an M0 interconnect structure, as shown in FIG. 2C).

The layout 200B further includes patterns 231 and 233, each of which is configured to form a backside via structure, sometimes referred to as VB (hereinafter "VB 231" and "VB 233" respectively) that directly connects to a bottom of a corresponding MD (e.g., MD 211) from its backside, and thus connects the corresponding MD to a backside layer (e.g., BM0) on the backside of the substrate.

Above these middle-end structures on the frontside of the substrate, metallization layers can be formed, e.g., M0, M1, M2, M3, etc., each of which includes a number of metal tracks or lines (e.g., 242, 243, 244 in FIG. 2C) embedded in a corresponding dielectric material (e.g., inter-metal dielectric (IMD)/inter-layer dielectric (ILD)). For example, the layout 200B may further include patterns configured to form metal tracks in the M0 layer (e.g., "M0 track 242," "M0 track 243" and "M0 track 244" in FIG. 2C).

The layout 200B can include other patterns to form respective interconnect structures or via structures to electrically couple a part or component in one layer (e.g., M1) of the memory device to a corresponding part or component in another layer (e.g., M2). For example, through the via structures 222, 223 and 224, as well as other interconnect structures, the gate terminal 120G of the programming transistor 120 is coupled to a WLP1, the gate terminal 124G of the first reading transistor 124 is coupled to a WLR1, and the gate terminal 126G of the second reading transistor 126 is coupled to a WLR2. For example, through VB 231 and VB 233, as well as other structures, the source/drain terminals 124S and 126S are respectively coupled to the bit lines BL1 and BL2 that are formed on a backside of the substrate (in FIG. 2C).

As shown in FIG. 2B, in some embodiments, at least two VGs (such as 222 and 224) coupled to the gate terminals of the programming transistor and reading transistors of the memory cell are formed along a virtual line (e.g., X direction), while one of the VGs (such as 223) is offset from the virtual line. In other embodiments (not shown), all the VGs (such as 222, 223 and 224) are aligned along a virtual line (e.g., X direction).

Referring to FIG. 2C, in the active region 202, a number of channels (e.g., 251, 252, 253) and epitaxial structures (e.g., 261, 262, 263, 264) can be formed. Each of the channels can be overlaid or wrapped by a corresponding one of the gate structures (e.g., 124G, 120G, 126G), and each of the epitaxial structures can be overlaid by a corresponding one of the MDs (e.g., 211, 212, 213, 214). The programming transistor 120, the first reading transistor 124 and the second reading transistor 126 can be formed from the active region 202. VGs (e.g., 222, 223 and 224) are formed on the gate structures (e.g., 124G, 120G, 126G) to connect them to metal tracks (e.g., 242, 243, 244) formed in an upper layer (e.g., M0). VBs (e.g., 231, 233) are formed to respectively connect the MDs (e.g., 211, 214) of the second source/drain terminals 261 and 264 of the first and the second reading transistors 124 and 126 to BL1 and BL2 that are disposed in a backside metallization layer (e.g., BM0).

As shown in FIG. 2C, in some embodiments, a memory device 200C includes a substrate 201 having a first side (frontside) 203 and a second side (backside) 205 opposite to the first side 203, and an anti-fuse memory cell 103 formed on the first side 203 of the substrate 201. The memory cell 103 randomly presents a first logic state (e.g., 1) or a second logic state (e.g., 0), and includes a programming transistor 120 having a first source/drain terminal 262 and a second source/drain terminal 263, a first reading transistor 124 having a first source/drain terminal 262 coupled to the first source/drain terminal of the programming transistor 120, and a second reading transistor 126 having a first source/drain terminal 263 coupled to the second source/drain terminal of the programming transistor 120. The first reading transistor 124 has a second source/drain terminal 261 operatively coupled to a bit line BL1 disposed in a backside layer (e.g., BM0) via MD 211 and VB 231, and the second reading transistor 126 has a second source/drain terminal 264 operatively coupled to a bit line BL2 disposed in the backside layer (e.g., BM0) via MD 214 and VB 233.

Figure 3:
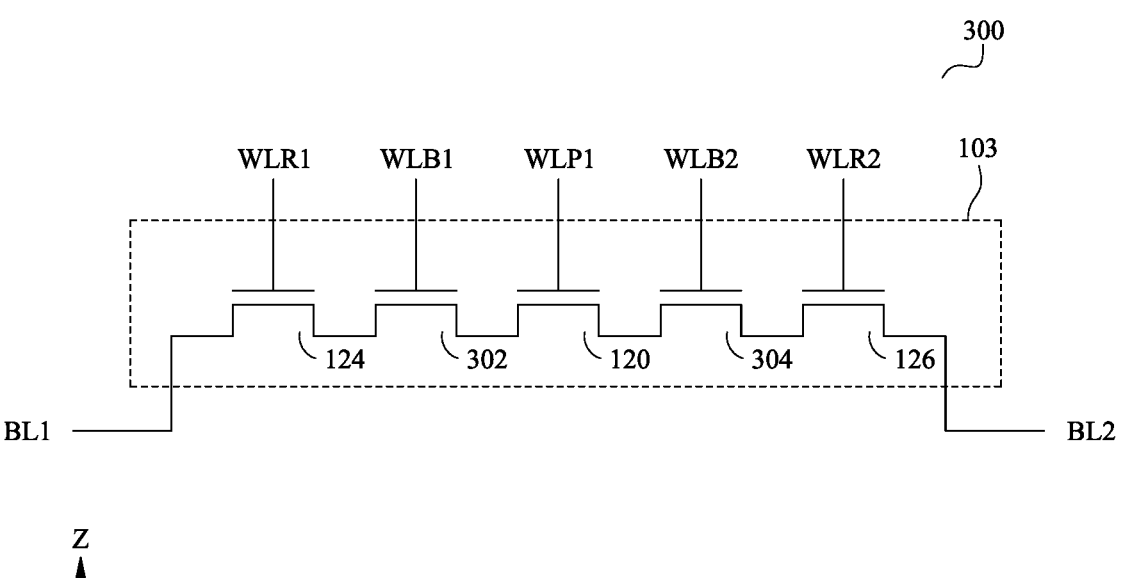
FIG. 3 illustrates an example circuit diagram of a portion of a memory device in accordance with other embodiments.

FIG. 3 illustrates an example circuit diagram of a memory device 300 accordance with other embodiments. In some embodiments, the memory device 300 includes an anti-fuse memory cell 103, and a first bit line BL1 and a second bit line BL2 coupled to the anti-fuse memory cell 103. The anti-fuse memory cell 103 of the memory device 300 as shown in FIG. 3 is configured substantially similar to the anti-fuse memory cell 103 of the memory device 200A as shown in FIG. 2A but have some differences.

As shown in FIG. 3, the anti-fuse memory cell 103 of the memory device 300 is implemented as a five-transistor (5T) symmetric configuration, and includes a first reading transistor 124, a second reading transistor 126, a programming transistor 120 coupled between the first reading transistor 124 and the second reading transistor 126 in series, a first stage transistor 302 coupled between the programming transistor 120 and the first reading transistor 124 in series, and a second stage transistor 304 coupled between the programming transistor 120 and the second reading transistor 126 in series.

Also as shown in FIG. 3, in some embodiments, the programming transistor 120 is gated by WLP1, the first reading transistor 124 is gated by WLR1, the second reading transistor 126 is gated by WLR2, the first stage transistor 302 is gated by WLB1, and the second stage transistor 304 is gated by WLB2. In some embodiments, a source/drain terminal of the first reading transistor 124 is coupled to a bit line BL1, and a source/drain terminal of the second reading transistor 126 is coupled to another bit line BL2. In some embodiments, referring to FIG. 2C, the anti-fuse memory cell 103 is formed over a frontside 203 of a substrate 201, and the bit lines BL1 and BL2 are formed in a metallization layer (e.g., BM0) over a backside 205 of the substrate 201.

Figure 4:
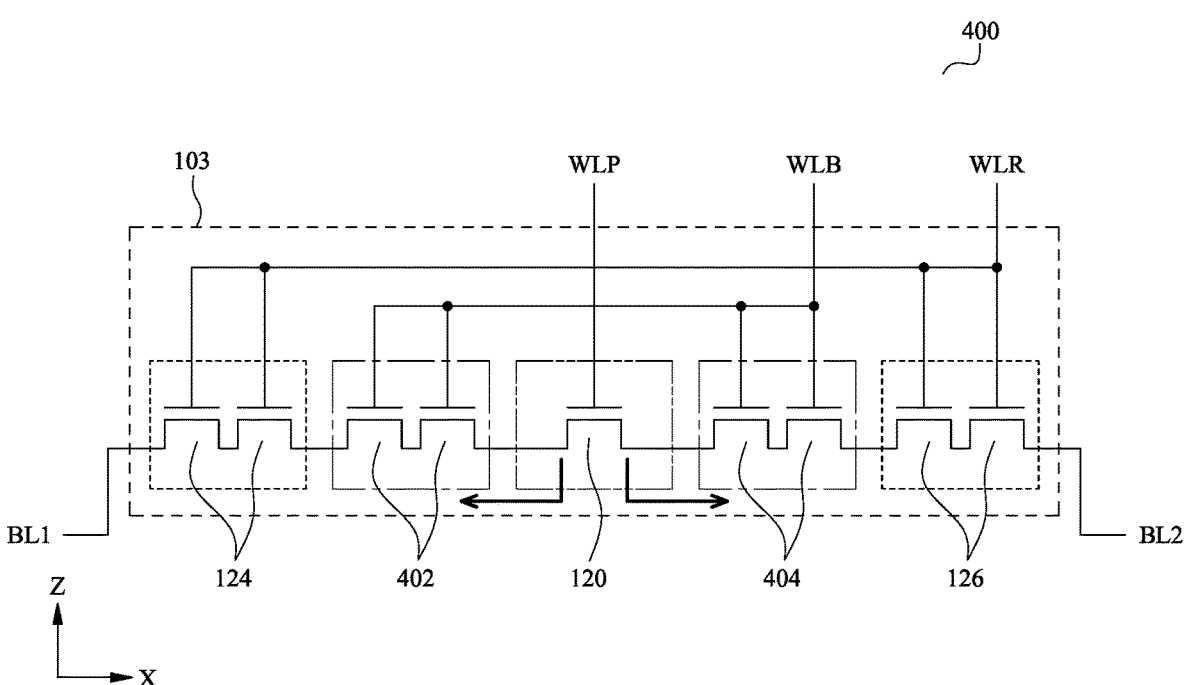
FIG. 4 illustrates an example circuit diagram of a portion of a memory device in accordance with yet other embodiments.

FIG. 4 illustrates an example circuit diagram of a memory device 400 in accordance with yet other embodiments. The anti-fuse memory cell 103 of the memory device 400 as shown in FIG. 4 is similar to the anti-fuse memory cell 103 of the memory device 300 as shown in FIG. 3 but has some differences.

As shown in FIG. 4, the anti-fuse memory cell 103 of the memory device 400 is implemented as a nine-transistor (9T) symmetric configuration, and includes a pair of first reading transistors 124, a pair of second reading transistors 126, a programming transistor 120 coupled between the pair of first reading transistors 124 and the pair of second reading transistors 126 in series, a pair of first stage transistors 402 coupled between the programming transistor 120 and the pair of first reading transistors 124 in series, and a pair of second stage transistors 404 coupled between the programming transistor 120 and the pair of second reading transistors 126 in series.

Also as shown in FIG. 4, in some embodiments, the programming transistor 120 is gated by WLP, the pair of first reading transistors 124 and the pair of second reading transistors 126 are commonly gated by WLR, and the pair of first stage transistor 402 and the pair of second stage transistors 404 are commonly gated by WLB. In some embodiments, a source/drain terminal of one of the pair of first reading transistors 124 is coupled to a bit line BL1, and a source/drain terminal of one of the pair of second reading transistors 126 is coupled to another bit line BL2. In some embodiments, referring to FIG. 2C, the anti-fuse memory cell 103 is formed over a frontside 203 of a substrate 201, and the bit lines BL1 and BL2 are formed over a backside 205 of the substrate 201.

Figure 5:
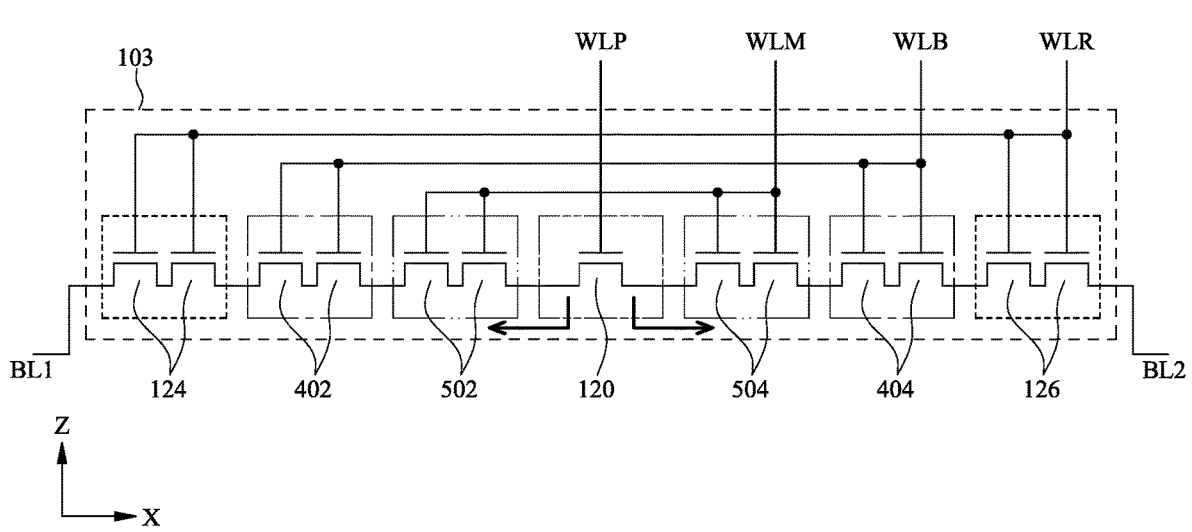
FIG. 5 illustrates an example circuit diagram of a portion of a memory device in accordance with still yet other embodiments.

FIG. 5 illustrates an example circuit diagram of a memory device 500 in accordance with still yet other embodiments. The anti-fuse memory cell 103 of the memory device 500 as shown in FIG. 5 is similar to the anti-fuse memory cell 103 of the memory device 400 as shown in FIG. 4 but has some differences.

As shown in FIG. 5, the anti-fuse memory cell 103 of the memory device 500 is implemented as a thirteen-transistor (13T) symmetric configuration, and includes a pair of first reading transistors 124, a pair of second reading transistors 126, a programming transistor 120 coupled between the pair of first reading transistors 124 and the pair of second reading transistors 126 in series, a pair of first stage transistors 402 coupled between the programming transistor 120 and the pair of first reading transistors 124 in series, a pair of second stage transistors 404 coupled between the programming transistor 120 and the pair of second reading transistors 126 in series, a pair of third stage transistors 502 coupled between the programming transistor 120 and the pair of first stage transistors 402 in series, and a pair of fourth stage transistors 504 coupled between the programming transistor 120 and the pair of second stage transistors 404 in series.

Also as shown in FIG. 5, in some embodiments, the programming transistor 120 is gated by WLP, the pair of first reading transistors 124 and the pair of second reading transistors 126 are commonly gated by WLR, the pair of first stage transistor 402 and the pair of second stage transistors 404 are commonly gated by WLB, and the pair of third stage transistors 502 and the pair of fourth stage transistors 504 are commonly gated by WLM. In some embodiments, a source/drain terminal of one first reading transistor 124 is coupled to a bit line BL1, and a source/drain terminal of one second reading transistor 126 is coupled to another bit line BL2.

In other embodiments, the anti-fuse memory cell 103 of the memory device 500 is implemented as a N-transistor (NT) symmetric configuration, in which N can be odd integers such as 3, 5, 7, 9, 11, 13, 15, while remaining within the scope of the present disclosure. With the NT symmetrical structure and additional stage transistors inserted between the programming transistor and the first and the second reading transistors, voltage difference among the transistors can be effectively reduced, thereby advantageously avoiding large voltage difference.

Figure 6:
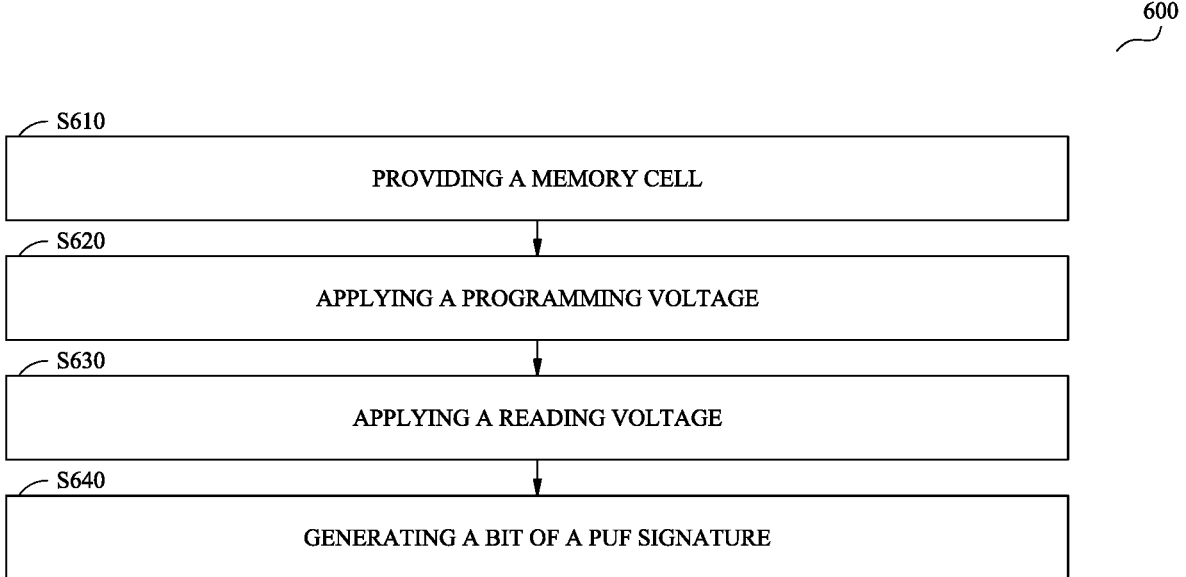
FIG. 6 is an example flow chart of a method for operating a memory device in accordance with some embodiments.

FIG. 6 is an example flow chart of a method 600 for operating a memory device (e.g., 200A as shown in FIG. 2A) in accordance with some embodiments. It is understood that additional operations can be provided before, during, and after processes discussed in FIG. 6, and some of the operations described below can be replaced or eliminated, for additional embodiments of the method. The order of the operations/processes may be interchangeable and at least some of the operations or processes may be performed in a different sequence. In some embodiments, at least two or more operations or processes are performed overlapping in time, or almost simultaneously.

In operation S610, as shown in FIGS. 2A-2C and 6, a memory cell 103 is provided over a frontside 203 of a substrate 201. In some embodiments, the memory cell 103 includes a programming transistor 120, a first reading transistor 124, and a second reading transistor 126, in which the programming transistor 120 is coupled in series between the first reading transistor 124 and the second reading transistor 126. The programming transistor 120 includes a gate metal 121, and a gate dielectric layer 123 under the gate metal 121 and including a first dielectric portion 123A and a second dielectric portion 123B.

In operation S620, as shown in FIGS. 2A-2C and 6, during a programming process, a programming voltage WLP1 is applied on a gate terminal 120G of the programming transistor 120 to randomly break down either the first dielectric portion 123A or the second dielectric portion 123B of the gate dielectric layer 123 of the programming transistor 120. As mentioned above, the memory cell 103 randomly presents a logic state of either a first logic state (e.g., 1) or a second logic state (e.g., 0) based on which of the first dielectric portion 123A or the second dielectric portion 123B has been broken down. For example, the first logic state represents that a first conduction path through the first dielectric portion 123A is established, while the second logic state represents that a second conduction path through the second dielectric portion 123B is established.

In operation S630, as shown in FIGS. 2A-2C and 6, during a reading process, a reading voltage is applied on the gate terminal 120G of the programming transistor 120 to identify whether the first conduction path through the first dielectric portion 123A or the second conduction path through the second dielectric portion 123B is established. The first conduction path extends from the gate terminal 120G, through the first dielectric portion 123A and the first reading transistor 124, to a first bit line BL1, while the second conduction path extends from the gate terminal 120G, through the second dielectric portion 123B and the second reading transistor 126, to a second bit line BL2.

In some embodiments, as shown in FIG. 2C, the first bit line BL1 and second bit line BL2 are formed in a metallization layer (e.g., M0) on a backside 205 of the substrate 201 opposite to the frontside 203. In some embodiments, in the reading process, a bit line voltage (e.g., a low BL voltage 0V or a high BL voltage 0.75V) is applied to corresponding source/drain terminals of reading transistors of a memory cell through bit lines (e.g., BL1 and BL2) that are formed on the backside of the substrate.

In operation S640, as shown in FIG. 2A and FIG. 6, during or after the reading process, a bit of a Physically Unclonable Function (PUF) signature for the memory cell 103 is detected based on whether the first conduction path or the second conduction path is established. In some embodiments, upon determining a first conduction path through the first dielectric portion 123A established, a bit (e.g., 1) of a PUF signature for the memory cell 103 is detected. Otherwise, upon determining a second conduction path through the second dielectric portion 123B established, another bit (e.g., 0) of a PUF signature for the memory cell 103 is detected.

In this way, all bits of PUF signature for all the anti-fuse memory cells 103 of the memory device 100 as shown in FIG. 1A can be generated and detected, and thus a PUF signature of the memory device can be securely generated and detected.

FIG. 7 is an example flow chart of a method 700 for forming a memory device in accordance with some embodiments. The memory device (e.g., 200A of FIG. 2A, 200C in FIG. 2C) can include at least three transistors formed on a frontside of a substrate, and at least two bit lines formed on a backside of the substrate. In some embodiments, the method 700 can be performed to form a memory device based on the layout 200B as shown in FIG. 2B, and thus, some of the references used above may be reused in the following discussion of the method 700. It is noted that the method 700 is merely an example and is not intended to limit the present disclosure. Accordingly, it is understood that additional operations may be provided before, during, and after the method 700 of FIG. 7, and that some other operations may only be briefly described herein.

The method 700 starts with operation S702 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 700 continues to operation S704 in which a stack, including an alternating series of first nanostructures and second nanostructures, is formed, in accordance with various embodiments. Such a stack can be formed based on one of the (active region) patterns discussed above. The stack can be formed in a frontside of the substrate. In some embodiments, the first nanostructures may include SiGe sacrificial nanostructures, and the second nanostructures may include Si channel nanostructures. Such a stack may sometimes be referred to as a superlattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The method 700 continues to operation S706 in which a number of dummy gate structures are formed, in accordance with various embodiments. Such a dummy gate structure can be formed based on one of the (gate structure) patterns discussed above. The dummy gate structure can extend along a direction perpendicular to the lengthwise direction of the dielectric fin structure (and the stack). Further, the dummy gate structure may be formed shorter than the dielectric fin structure in one of various embodiments, and thus, the dummy gate structure, as formed, is cut (or otherwise separated) by the dielectric fin structure.

The dummy gate structure can be formed by depositing amorphous silicon (a-Si) over the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (RIE) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

The method 700 proceeds to operation S708 in which inner spacers are formed by replacing end portions of each of the SiGe sacrificial nanostructures with a dielectric material, in accordance with various embodiments. Upon forming the dummy gate structure overlaying certain portions of the stack (e.g., the portions of the stack separated by the dielectric fin structure), the non-overlaid portions of the stack are removed. Next, respective end portions of each SiGe sacrificial nanostructure of the overlaid stack are removed. The inner spacers are formed by filling such recesses of each SiGe sacrificial nanostructure with a dielectric material by chemical vapor deposition (CVD), or by monolayer doping (MLD) of nitride followed by spacer RIE. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 700 proceeds to operation S710 in which a number of epitaxial structures are formed, in accordance with various embodiments. Upon forming the inner spacers, the epitaxial structures are formed using an epitaxial layer growth process on exposed ends of the Si nanostructures. In-situ doping (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 700 proceeds to operation S712 in which the dummy gate structures and the remaining SiGe sacrificial nanostructures are replaced with respective active gate structures, in accordance with various embodiments. Subsequently to forming the inter-layer dielectric, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces and sidewalls of each of the Si channel nanostructures can be exposed, except for the sidewall in contact with the dielectric fin structure. Next, a number of active gate structures can be formed to wrap around each of the Si channel nanostructures, except for the sidewall contacting the dielectric fin structure. Each of the active gate structures includes at least a gate dielectric layer (e.g., a high-k dielectric layer) and a gate metal layer (e.g., a work function metal layer). Upon the active gate structures being formed, the transistors of the memory device can be formed.

The method 700 proceeds to operation S714 in which a number of frontside interconnect structures are formed, in accordance with various embodiments. Upon forming the transistors, a number of middle-end interconnect structures (e.g., VGs, MDs) are formed over the transistors. For example, a number of VGs (e.g., 222, 223, 224) can be formed to connect to gate terminals of the transistors, respectively, and a number of MDs (e.g., 211, 212, 213, 214) can be formed to connect to source/drain terminals of the transistors. Further, a number of back-end interconnect structures can be formed over the middle-end interconnect structures. Such back-end interconnect structures include the above-described M0 tracks (e.g., 242, 243, 244), and other metal tracks in the upper metallization layers (e.g., M1, M2, not shown). Through the VGs, each of the transistors can be gated. For example, the programming transistor is gated to a WLP, and the reading transistors are gated to WLRs.

The frontside interconnect structure is formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The frontside interconnect structures can be formed by overlaying the frontside of the substrate with the above-listed metal material by, for example, chemical vapor deposition (CVD), physical vapor deposition (PVD), electroless plating, electroplating, or combinations thereof.

The method 700 proceeds to operation S716 in which a number of backside interconnect structures are formed in accordance with various embodiments. Upon forming the back-end metal tracks, the substrate is flipped, and a number of backside interconnect structures (e.g., BM0 tracks, BM1 tracks) are formed over the backside of the substrate. For example, after the substrate is flipped, a polishing process may be performed on the backside of the substrate until a bottom surface of the epitaxial structures (e.g., the source/drain terminals formed in operation S710) is exposed. Next, one or more dielectric layers are formed over the polished backside surface, followed by forming the backside via structures that can each extend through the one or more dielectric layers to reach the bottom surface of a corresponding epitaxial structure. Next, the backside interconnect structures can be formed in respective backside metallization layers.

The backside interconnect structure is formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The backside interconnect structures can be formed by overlaying the backside of the substrate with the above-listed metal material by, for example, chemical vapor deposition (CVD), physical vapor deposition (PVD), electroless plating, electroplating, or combinations thereof. For example, VBs 231 and 233 are formed in a backside layer (e.g., BM0) on the backside of the substrate, and directly connects bottoms of corresponding MDs 211 and 214 from their backside.

In one aspect of the present disclosure, a memory device is disclosed. The memory device includes a memory cell that randomly presents either a first logic state or a second logic state, a first bit line, and a second bit line. The memory cell is formed on a first side of a substrate and includes a programming transistor having a first source/drain terminal and a second source/drain terminal, a first reading transistor having a first source/drain terminal coupled to the first source/drain terminal of the programming transistor, and a second reading transistor having a first source/drain terminal coupled to the second source/drain terminal of the programming transistor. The first bit line is formed on a second side of the substrate opposite to the first side, and the second bit line is formed on the second side of the substrate. The first bit line is operatively coupled to a second source/drain terminal of the first reading transistor, and the second bit line is operatively coupled to a second source/drain terminal of the second reading transistor.

In another aspect of the present disclosure, a memory system is disclosed. The memory system includes a memory array including a plurality of memory cells formed on a first side of a substrate, and an authentication circuit operatively coupled to the memory array and configured to generate a bit of a Physically Unclonable Function (PUF) signature for each of the plurality of memory cells based on a logic state thereof. Each of the plurality of memory cells presents the logic state of either a first logic state or a second logic state, and includes a programming transistor including a first source/drain terminal and a second source/drain terminal; a first reading transistor including a first source/drain terminal operatively coupled to the first source/drain terminal of the programming transistor, and a second source/drain terminal operatively coupled to a first bit line; and a second reading transistor including a first source/drain terminal coupled to the second source/drain terminal of the programming transistor, and a second source/drain terminal coupled to a second bit line.

In yet another aspect of the present disclosure, a method for operating a memory device is disclosed. The method includes providing a memory cell including at least a programming transistor, a first reading transistor, and a second reading transistor coupled in series, with the programming transistor coupled between the first reading transistor and the second reading transistor; applying a programming voltage on a gate terminal of the programming transistor to randomly break down either a first portion or a second portion of a gate dielectric layer of the programming transistor, wherein the first portion is coupled between the gate terminal and a first source/drain terminal of the first reading transistor and the second portion is coupled between the gate terminal and a first source/drain terminal of the second reading transistor; applying a reading voltage on the gate terminal of the programming transistor to identify whether a first conduction path through the first portion or a second conduction path through the second portion is established; and generating a bit of a Physically Unclonable Function (PUF) signature for the memory cell based on whether the first conduction path or the second conduction path is established.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell that randomly presents either a first logic state or a second logic state, wherein the memory cell is formed on a first side of a substrate and comprises:
a programming transistor having a first source/drain terminal, a second source/drain terminal, and a gate terminal operatively connected to a programming word line that is configured to receive a programming voltage;
a first reading transistor having a first source/drain terminal coupled to the first source/drain terminal of the programming transistor; and
a second reading transistor having a first source/drain terminal coupled to the second source/drain terminal of the programming transistor;
a first bit line formed on a second side of the substrate opposite to the first side; and
a second bit line formed on the second side of the substrate and different from the first bit line;
wherein the first bit line is operatively coupled to a second source/drain terminal of the first reading transistor, and the second bit line is operatively coupled to a second source/drain terminal of the second reading transistor.

2. The memory device of claim 1, wherein the first reading transistor has a gate terminal operatively connected to a first reading word line, and the second reading transistor has a gate terminal operatively connected to a second reading word line.

3. The memory device of claim 2, wherein the gate terminal of the programming transistor has a gate metal and a gate dielectric layer, wherein the gate dielectric layer includes a first portion and a second portion, and wherein the first portion is coupled between the gate metal and the first source/drain terminal of the programming transistor and the second portion is coupled between the gate metal and the second source/drain terminal of the programming transistor.

4. The memory device of claim 3, wherein either the first portion or the second portion is configured to be randomly broken down.

5. The memory device of claim 4, wherein the first portion is broken down to present the first logic state, and the second portion is broken down to present the second logic state.

6. The memory device of claim 2, wherein the programming word line, the first reading word line, and the second reading word line are formed on the first side of the substrate.

7. A memory system, comprising:
a memory array comprising a plurality of memory cells formed on a first side of a substrate, each of the plurality of memory cells presenting a logic state of either a first logic state or a second logic state and comprising:
a programming transistor comprising a first source/drain terminal, a second source/drain terminal, and a gate terminal operatively connected to a programming word line that is configured to receive a programming voltage;
a first reading transistor comprising a first source/drain terminal operatively coupled to the first source/drain terminal of the programming transistor, and a second source/drain terminal operatively coupled to a first bit line formed on a second side of the substrate opposite to the first side; and
a second reading transistor comprising a first source/drain terminal coupled to the second source/drain terminal of the programming transistor, and a second source/drain terminal coupled to a second bit line formed on the second side of the substrate, the second bit line being different from the first bit line; and
an authentication circuit operatively coupled to the memory array and configured to generate a bit of a Physically Unclonable Function (PUF) signature for each of the plurality of memory cells based on the logic state thereof.

8. The memory system of claim 7, wherein the first reading transistor includes a gate terminal operatively coupled to a first reading word line, and the second reading transistor includes a gate terminal operatively coupled to a second reading word line.

9. The memory system of claim 8, wherein the gate terminal of the programming transistor includes a gate metal and a gate dielectric layer, and wherein the gate dielectric layer includes a first portion coupled between the gate metal and the first source/drain terminal of the programming transistor, and a second portion coupled between the gate metal and the second source/drain terminal of the programming transistor.

10. The memory system of claim 9, wherein the first portion or the second portion of the gate dielectric layer of the programming transistor is configured to be randomly broken down.

11. The memory system of claim 10, wherein the logic state of each of the plurality of memory cells is determined based on a preceding breakdown of the first portion or the second portion of the gate dielectric layer of the programming transistor.

12. The memory system of claim 11, wherein upon the preceding breakdown of the first portion being identified, the first logic state presents the logic state, and wherein upon the preceding breakdown of the second portion being identified, the second logic state presents the logic state.

13. The memory system of claim 7, wherein a first via structure connects the second source/drain terminal of the first reading transistor to the first bit line, and wherein a second via structure connects the second source/drain terminal of the second reading transistor to the second bit line.

14. The memory system of claim 7, wherein each of the plurality of memory cells further comprises:

one or more first stage transistors coupled between the programming transistor and the first reading transistor in series; and one or more second stage transistors coupled between the programming transistor and the second reading transistor in series.

15. A method for forming a memory device, comprising:

providing a substrate;

forming a memory cell on a first side of the substrate, comprising:

forming, on the first side, a programming transistor having a first source/drain terminal, a second source/drain terminal, and a gate terminal operatively connected to a programming word line that is configured to receive a programming voltage;

forming, on the first side, a first reading transistor having a first source/drain terminal coupled to the first source/drain terminal of the programming transistor; and forming, on the first side, a second reading transistor having a first source/drain terminal coupled to the second source/drain terminal of the programming transistor;

forming a first bit line formed on a second side of the substrate opposite to the first side; and forming a second bit line formed on the second side of the substrate and different from the first bit line.

16. The method of claim 15, further comprising:

forming a connection between the first bit line and a second source/drain terminal of the first reading transistor.

17. The method of claim 16, further comprising:

forming a connection between the second bit line and a second source/drain terminal of the second reading transistor.

18. The method of claim 15, wherein the memory cell is configured to randomly present either a first logic state or a second logic state.

19. The memory device of claim 1, wherein the memory cell further comprises:

one or more first stage transistors coupled between the programming transistor and the first reading transistor in series; and one or more second stage transistors coupled between the programming transistor and the second reading transistor in series.

20. The memory device of claim 1, further comprising:

a first via structure connecting the second source/drain terminal of the first reading transistor to the first bit line; and a second via structure connecting the second source/drain terminal of the second reading transistor to the second bit line.

\* \* \* \* \*